US012805021B2

(12) United States Patent
Klebanov et al.

(10) Patent No.: US 12,805,021 B2
(45) Date of Patent: Nov. 17, 2026

(54) ELECTROSTATIC DISCHARGE PROTECTION FOR STACK DIE TECHNOLOGY

(71) Applicant: Allegro MicroSystems, LLC, Manchester, NH (US)

(72) Inventors: Maxim Klebanov, Palm Coast, FL (US); Felix Palumbo, Buenos Aires (AR); Washington Lamar, Mont Vernon, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 393 days.

(21) Appl. No.: 18/443,830

(22) Filed: Feb. 16, 2024

(65) Prior Publication Data

US 2025/0267952 A1 Aug. 21, 2025

(51) Int. Cl.
*H10D 89/60* (2025.01)
*G01R 33/00* (2006.01)
(Continued)

(52) U.S. Cl.
CPC ....... *H10D 89/611* (2025.01); *G01R 33/0076* (2013.01); *G01R 33/096* (2013.01); *G01R 33/098* (2013.01); *H10D 84/221* (2025.01)

(58) Field of Classification Search
CPC .... H10D 89/611; H10D 84/221; H10D 88/00; G01R 33/0076; G01R 33/096; G01R 33/098
See application file for complete search history.

(56) References Cited

U.S. PATENT DOCUMENTS 7,573,112 B2 8/2009 Taylor
7,676,914 B2 3/2010 Taylor
(Continued)

FOREIGN PATENT DOCUMENTS

EP 2008308 A2 12/2008
JP 5362548 B2 9/2013
(Continued)

OTHER PUBLICATIONS

Yibo et al., "Investigation of the polysilicon p-i-n diode and diode string as a process compatible and portable ESD protection device"; Journal of Semiconductors, vol. 33, No. 7; Jul. 2012; 5 pages.

*Primary Examiner* — Herve-Louis Y Assouman
(74) *Attorney, Agent, or Firm* — Daly, Crowley, Mofford & Durkee, LLP

(57) ABSTRACT

According to one aspect of the present disclosure, a semiconductor electrostatic discharge (ESD) device includes a substrate. In some embodiments one or more dielectric layers disposed on the substrate. In some embodiments, there are one or more polysilicon diodes disposed within the one or more dielectric layers. In some embodiments, there is a metallization layer with two or more metal interconnect pads. In some embodiments, there are two or more vias, wherein a first via is connected to a first metal interconnect pad and a second via is connected to a second metal interconnect pad, wherein the polysilicon diodes are connected to the two or more vias, wherein the one or more polysilicon diodes are configured to provide ESD protection at the metal interconnect pads.

32 Claims, 7 Drawing Sheets

(51) Int. Cl.

| | |
|---|---|
| ***G01R 33/09*** | (2006.01) |
| ***H10D 84/00*** | (2025.01) |
| ***H10D 88/00*** | (2026.01) |

(56) References Cited

U.S. PATENT DOCUMENTS

| | | | | |
|---|---|---|---|---|
| 7,687,882 | B2 | 3/2010 | Taylor et al. | |
| 9,318,481 | B1 | 4/2016 | Wang et al. | |
| 9,941,224 | B2 | 4/2018 | Lamar et al. | |
| 10,145,904 | B2 | 12/2018 | Klebanov et al. | |
| 10,147,688 | B2 | 12/2018 | Wilkinson et al. | |
| 10,147,689 | B2 | 12/2018 | Lamar et al. | |
| 10,256,225 | B2 | 4/2019 | Klebanov et al. | |
| 10,468,485 | B2 | 11/2019 | Chetlur et al. | |
| 10,943,976 | B2 | 3/2021 | Chetlur et al. | |
| 11,289,590 | B1 * | 3/2022 | Najafi | H10D 48/387 |
| 11,303,116 | B2 | 4/2022 | Lamar et al. | |
| 11,967,650 | B2 | 4/2024 | Saxena et al. | |
| 2002/0086467 | A1 * | 7/2002 | Chang | H10F 77/148<br>257/67 |
| 2002/0142562 | A1 * | 10/2002 | Chan | H10D 30/0323<br>438/455 |
| 2008/0036453 | A1 | 2/2008 | Taylor | |
| 2014/0029145 | A1 * | 1/2014 | Mayerhofer | H10D 89/611<br>361/56 |
| 2015/0294966 | A1 * | 10/2015 | Weyers | H10D 89/611<br>257/49 |
| 2015/0340594 | A1 * | 11/2015 | Liou | H10N 50/01<br>257/421 |
| 2018/0234093 | A1 * | 8/2018 | Mauder | G06F 30/367 |

FOREIGN PATENT DOCUMENTS

| | | |
|---|---|---|
| KR | 10-1393682 | 5/2014 |
| WO | WO 2007/120697 | 10/2007 |

* cited by examiner

900

| Simplified process flow for polysilicon diodes | | |
|---|---|---|
| substrate | 910 | Monitor grade substrate. Silicon p-type |
| oxide | 920 | Grown or deposited thick dielectric layer (in the range of 0.5 um to 1.5 um) |
| Polysilicon | 930 | Polysilicon deposition; annealing; one or two lithography; implants; silicide |
| Metal 1 interconnect | 940 | CT and M1 region lithography and metal deposition |
| IMD | 950 | Thick dielectric layer |
| TMR block | 960 | |
| Passivation and PADS openings | 970 | |

*FIG. 9*

ELECTROSTATIC DISCHARGE PROTECTION FOR STACK DIE TECHNOLOGY

BACKGROUND

A magnetic field sensing element describes a variety of electronic elements that can sense a magnetic field. One such magnetic field sensing element is a magnetoresistance (MR) element. An MR element has a resistance that changes in relation to changes in a magnetic field experienced by the MR element. Examples of a MR element include: a tunnel magnetoresistance (TMR) element; and a giant magnetoresistance (GMR) element. Magnetic-field sensors may include bridges (e.g., a Wheatstone bridge). The bridges typically include four or more MR elements. MR elements in a bridge may include TMR elements. Each TMR element may include a plurality of pillars. Some MR elements may have a linear response range such that changes in resistance of the MR element is linear to changes in an applied magnetic field.

The implementation of multi-die systems often calls for an electrostatic discharge (ESD) protection for each die. Multi-die systems are the solution to address the challenges of systemic complexity, allowing for accelerated, cost-effective scaling of system functionality, reduced risk and time to market, lower system power with increasing throughput, and rapid creation of product variants.

SUMMARY

According to one aspect of the present disclosure, a semiconductor electrostatic discharge (ESD) device includes a substrate. In some embodiments, one or more dielectric layers are disposed on the substrate. In some embodiments, one or more polysilicon diodes are disposed within the one or more dielectric layers. In some embodiments, the ESD device includes a metallization layer with two or more metal interconnect pads. In some embodiments, the ESD device includes two or more vias, wherein a first via is connected to a first metal interconnect pad and a second via is connected to a second metal interconnect pad, wherein the polysilicon diodes are connected to the two or more vias, wherein the one or more polysilicon diodes are configured to provide ESD protection at the metal interconnect pads.

In some embodiments, the ESD device includes a magnetoresistance (MR) block layer disposed on the one or more dielectric layers, wherein the one or more polysilicon diodes are configured to provide ESD protection for the MR block layer.

According to another aspect of the present disclosure, a method for providing a semiconductor electrostatic discharge (ESD) device includes providing a substrate. In some embodiments, the method includes providing one or more dielectric layers on the substrate. In some embodiments, the method includes providing one or more polysilicon diodes within the one or more dielectric layers. In some embodiments, the method includes providing a metallization layer with two or more metal interconnect pads. In some embodiments, the method includes providing two or more vias, wherein a first via is connected to a first metal interconnect pad and a second via is connected to a second metal interconnect pad, wherein the polysilicon diodes are connected to the two or more vias, wherein the one or more polysilicon diodes are configured to provide ESD protection at the metal interconnect pads.

In some embodiments, the method includes providing a passivation layer on a surface of the dielectric layers and a surface of the metallization layer. In some embodiments, the method includes providing a magnetoresistance (MR) block layer on the one or more dielectric layers, wherein the one or more polysilicon diodes are configured to provide ESD protection for the MR block layer.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which:

FIG. 9 is an example of a process flow to form a semiconductor electrostatic discharge (ESD) device with a polysilicon diode.

DETAILED DESCRIPTION

Figure 1:
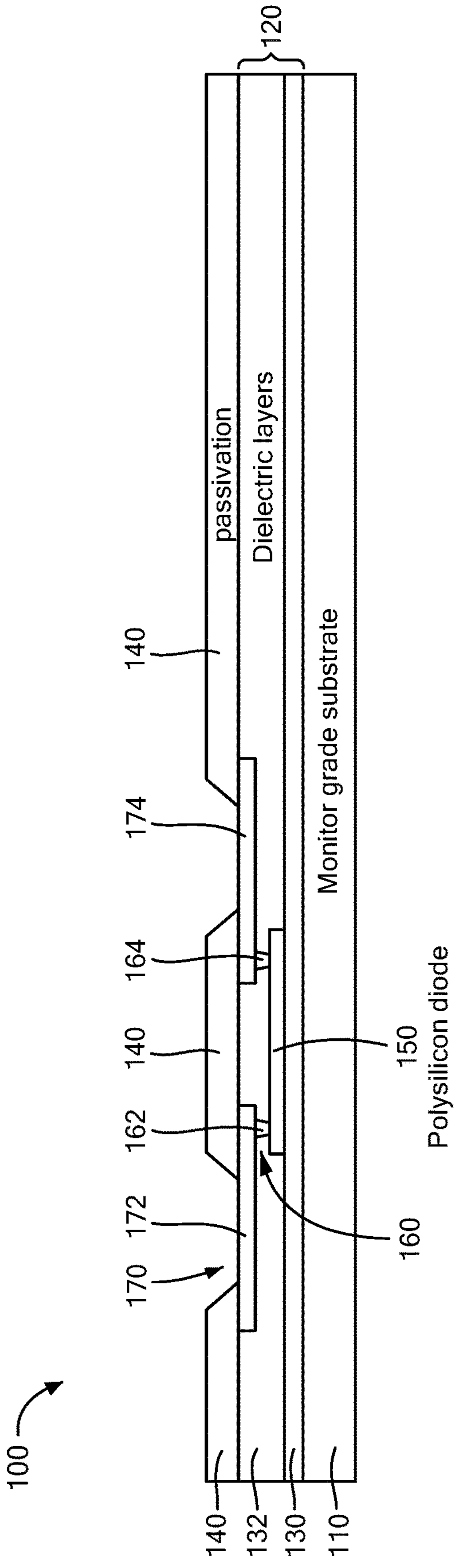
FIG. 1 is a side view of a cross section of a semiconductor electrostatic discharge device that includes a polysilicon diode.

Referring now to FIG. 1, a semiconductor electrostatic discharge (ESD) protection device 100 includes a polysilicon diode 150. One or more dielectric layers 120 are disposed on a substrate 110. The polysilicon diode 150 is disposed within the dielectric layers 120. One or more vias 160 are disposed within the dielectric layers 120 and connect the polysilicon diode 150 to a metallization layer 170 with two or more metal interconnect pads 172, 174. A passivation layer 140 is disposed on the metallization layer 170 and the dielectric layers 120. The polysilicon diode 150 is configured to provide ESD protection at the metallization layer 170. The polysilicon diode 150 is configured to provide or meet a desired breakdown voltage.

A first dielectric layer 130 is disposed on the substrate 110. The polysilicon diode 150 is disposed on the first dielectric layer 130. A second dielectric layer 132 is disposed on the first electric layer 130 and the polysilicon diode 150. While two dielectric layers are shown, more dielectric layers may be included.

The vias (referred to generally as 160, with specific examples identified as 162 and 164) connect the polysilicon diode 150 to the metallization layer 170. The metallization layer includes a first metal interconnect pad 172 positioned adjacent to a second metal interconnect pad 174. A first via 162 is disposed within the second dielectric layer 132 and connects to the polysilicon diode 150 and the first metal interconnect pad 172. A second via 164 is disposed within the second dielectric layer 132 and connects to the polysilicon diode 150 and the second metal interconnect pad 174.

One or more magnetoresistance (MR) block layers may be disposed on the metallization layer 170. The polysilicon diode 150 is configured to provide ESD protection for the MR block layer. The MR block layer comprises an MR sensor having one or more MR elements. The one or more MR elements comprise a plurality of MR elements configured as a bridge. The plurality of MR elements may comprise: tunnelling magnetoresistance (TMR) elements; one or more giant magnetoresistance (GMR) elements; and one or more anisotropic magnetoresistance (AMR) elements.

Figure 2:
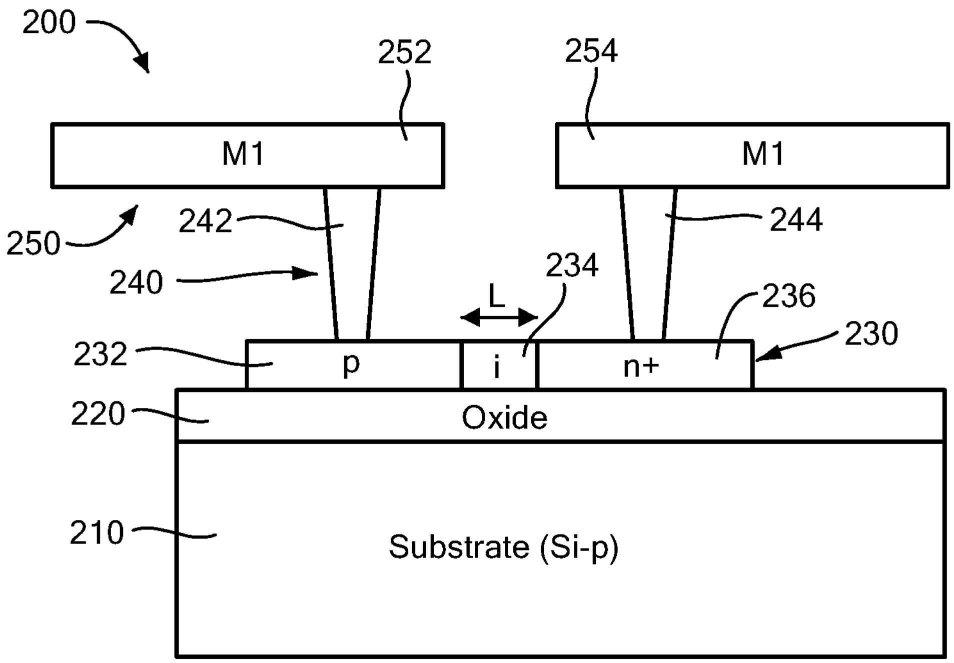
FIG. 2 is a side view of a cross section of an example of a semiconductor electrostatic discharge device that includes a polysilicon diode with a central region comprising an intrinsic region.

Referring now to FIG. 2, a semiconductor electrostatic discharge (ESD) protection device 200 includes a polysilicon diode 230 with a central region 234. Device 200 may be similar to or the same as semiconductor ESD protection device 100. A first dielectric layer 220 is disposed on a substrate 210. The polysilicon diode 230 is disposed on the first dielectric layer 220. The polysilicon diode 230 is formed from an n-p junction. A portion of the polysilicon diode 230 is doped with a p-type dopant forming a p-type region 232. A portion of the polysilicon diode 230 is doped with an n-type dopant forming an n-type region 236.

The central region 234 of the polysilicon diode 230 is disposed between the p-type region 232 and the n-type region 236. The central region 234 enables further control over the polysilicon diode 230 to provide the desired breakdown voltage. The central region 234 comprises an intrinsic region. In some examples, the central region 234 has a length (L) of about 0.1 micron to about 1 micron (+/−0.01 microns).

One or more vias 240 connect the polysilicon diode 230 to a metallization layer 250 with two or more metal interconnect pads 252, 254. A first via 242 connects the p-type region 232 to a first metal interconnect pad 252. A second via 244 connects the n-type region 236 to a second metal interconnect pad 254.

Figure 3:
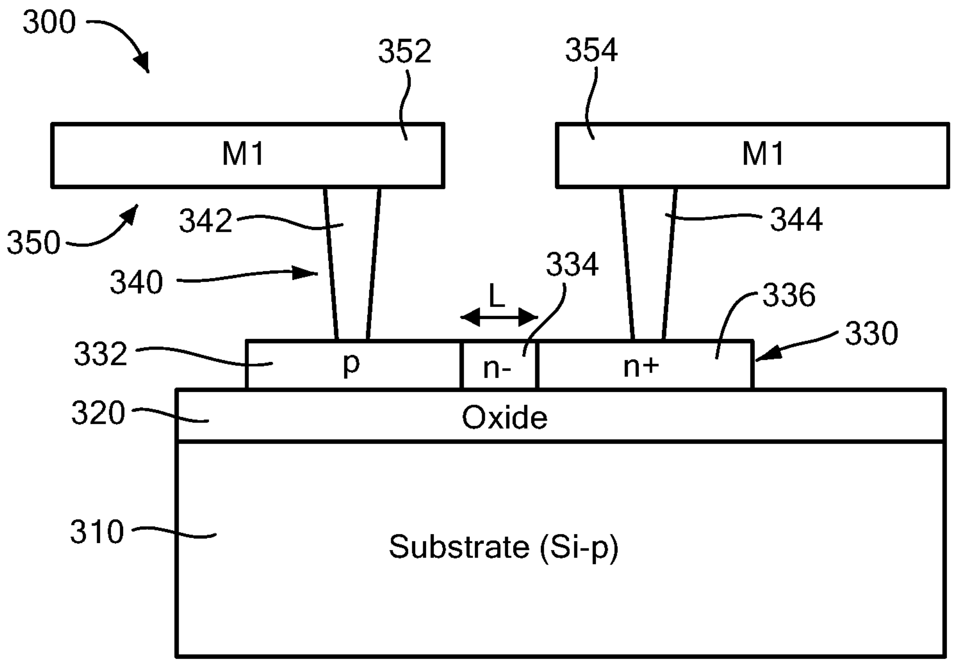
FIG. 3 is a side view of a cross section of an example of a semiconductor electrostatic discharge device that includes a polysilicon diode with a central region lightly doped with an n-type dopant.

Referring now to FIG. 3, a semiconductor electrostatic discharge (ESD) protection device 300 includes a polysilicon diode 330 with a central region 334 lightly doped with an n-type dopant. ESD protection device 300 may be similar to or the same as ESD protection device 100. A first dielectric layer 320 is disposed on a substrate 310. The polysilicon diode 330 is disposed on the first dielectric layer 320. A portion of the polysilicon diode 330 is doped with a p-type dopant forming a p-type region 332. A portion of the polysilicon diode 330 is doped with an n-type dopant forming an n-type region 336.

The central region 334 of the polysilicon diode 330 is disposed between the p-type region 332 and the n-type region 336. The central region 334 is lightly doped with an n-type dopant. The central region 334 has a length (L) of about 0.1 micron to about 1 micron (+/−0.01 microns).

One or more vias 340 connect the polysilicon diode 330 to a metallization layer 350 with two or more metal interconnect pads 352, 354. A first via 342 connects the p-type region 332 to a first metal interconnect pad 352. A second via 344 connects the n-type region 336 to a second metal interconnect pad 354.

Figure 4:
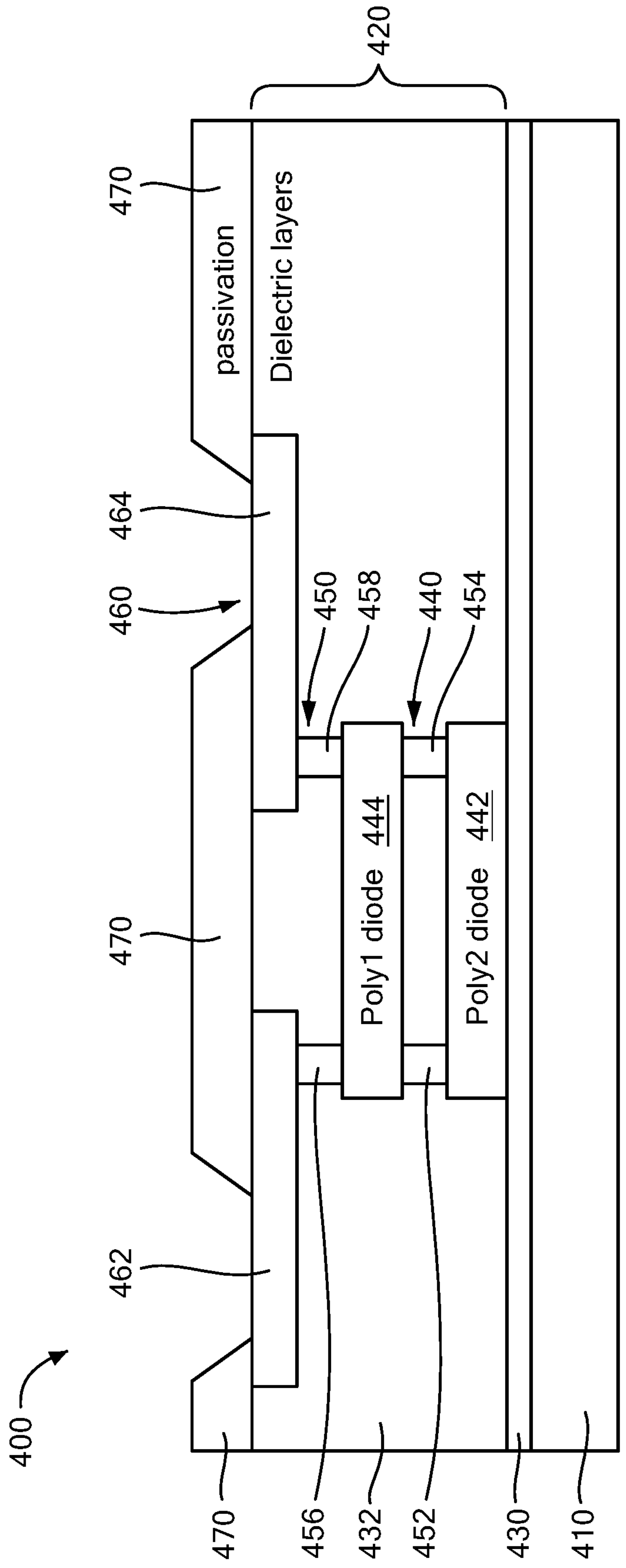
FIG. 4 is a side view of a cross section of an example of a semiconductor electrostatic discharge device that includes two polysilicon diodes connected in parallel.

Referring now to FIG. 4, a semiconductor ESD protection device 400 includes two polysilicon diodes 440 connected in parallel. One or more dielectric layers 420 are disposed on a substrate 410. The polysilicon diodes 440 are disposed within the dielectric layers 420. One or more vias 450 are disposed within the dielectric layers 420 and connect the polysilicon diodes 440 to a metallization layer 460 with two or more metal interconnect pads 462, 464. A passivation layer 470 is disposed on the metallization layer 460 and the dielectric layers 420. The polysilicon diodes 440 are configured to provide ESD protection at the metallization layer 460. The polysilicon diodes 440 are configured to provide a desired breakdown voltage.

A first dielectric layer 430 is disposed on a substrate 410. A second dielectric layer 432 is disposed on the first dielectric layer 430. While two dielectric layers are shown, more dielectric layers may be included. The polysilicon diodes 440 are disposed on the first dielectric layer 430 and within the second dielectric layer 432. A first polysilicon diode 442 is disposed on the first dielectric layer 430. A second polysilicon diode 444 is disposed adjacent to and above the first polysilicon diode 442 within the second dielectric layer 432. The two polysilicon diodes 440 are connected in parallel. The two polysilicon diodes 440 may be similar to or the same as polysilicon diode 230, 330.

The vias 450 connect the polysilicon diodes 440 to each other and to the metallization layer 460. The vias 452, 454 connect the two polysilicon diodes 440. A first via 452 is disposed in the second dielectric layer 432 and is connected on one side to the first polysilicon diode 442 and the second polysilicon diode 444. A second via 454 is disposed in the second dielectric layer 432 and is connected on an opposing side compared to the first via 452 to the first polysilicon diode 442 and the second polysilicon diode 444.

The vias 456, 458 connect the polysilicon diodes 440 to the metallization layer 460. A third via 456 is disposed in the second dielectric layer 432 and connects on one side the second polysilicon diode 444 to a first metal interconnect pad 462. A fourth via 458 is disposed in the second dielectric layer 432 and connects, on an opposing side compared to the third via 456, the second polysilicon diode 444 to a second metal interconnect pad 464.

Figure 5:
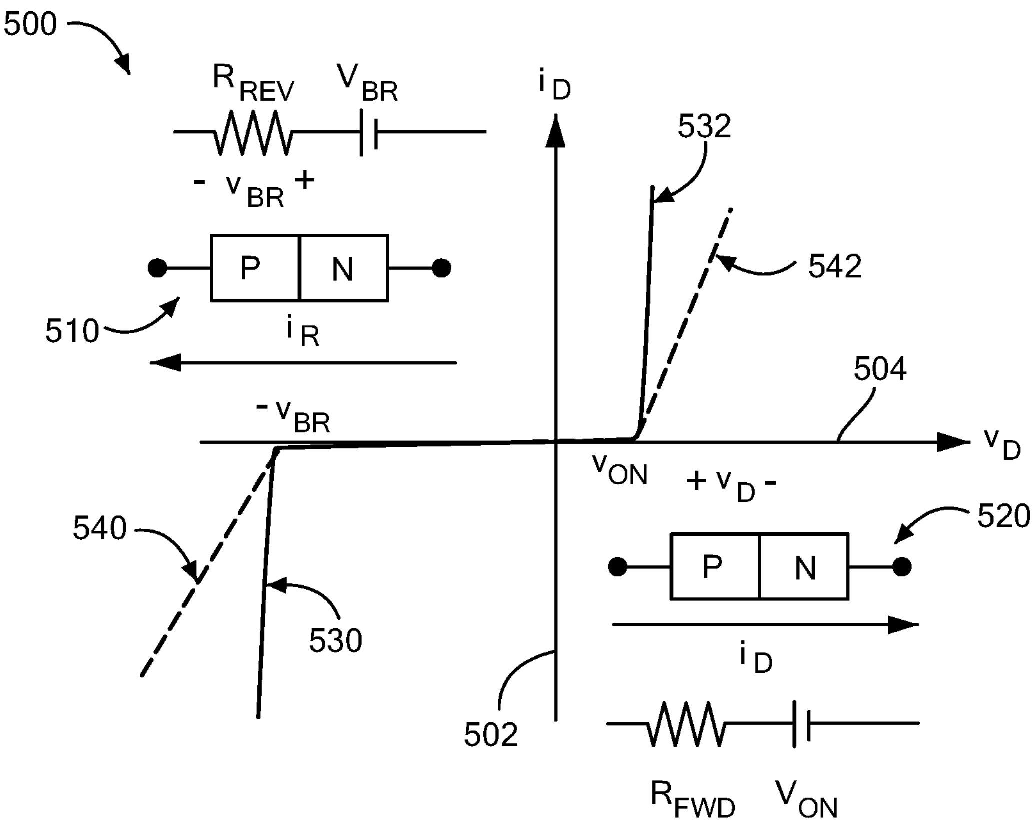
FIG. 5 is a graph disclosing voltage vs. current for a device with two similar polysilicon diodes.

Referring now to FIG. 5, a graph 500 discloses voltage 504 vs. current 502 for a semiconductor ESD protection device with two similar polysilicon diodes. The ESD protection device may be similar to or the same as semiconductor electrostatic discharge device 400.

A first example diode 510 was used to measure resistance for a reverse breakdown voltage. A first measurement 530 demonstrates $1/R_{REV}$ for two similar polysilicon diodes connected in parallel. For comparison, a second measurement 540 demonstrates $1/R_{REV}$ for a single polysilicon diode. As demonstrated, the semiconductor electrostatic discharge device with two similar polysilicon diodes has improved measurements compared to the semiconductor electrostatic discharge device with one polysilicon diode, as exhibited by the difference in the first measurement 530 and the second measurement 540.

A second example diode 520 was used to measure resistance for a forward voltage. A third measurement 532 demonstrates $1/R_{FWD}$ for two similar polysilicon diodes connected in parallel. For comparison, a fourth measurement 542 demonstrates $1/R_{FWD}$ for a single polysilicon diode. As demonstrated, the semiconductor electrostatic discharge device with two similar polysilicon diodes has improved measurements compared to the semiconductor electrostatic discharge device with one polysilicon diode, as exhibited by the difference in the third measurement 532 and the fourth measurement 542.

Figure 6:
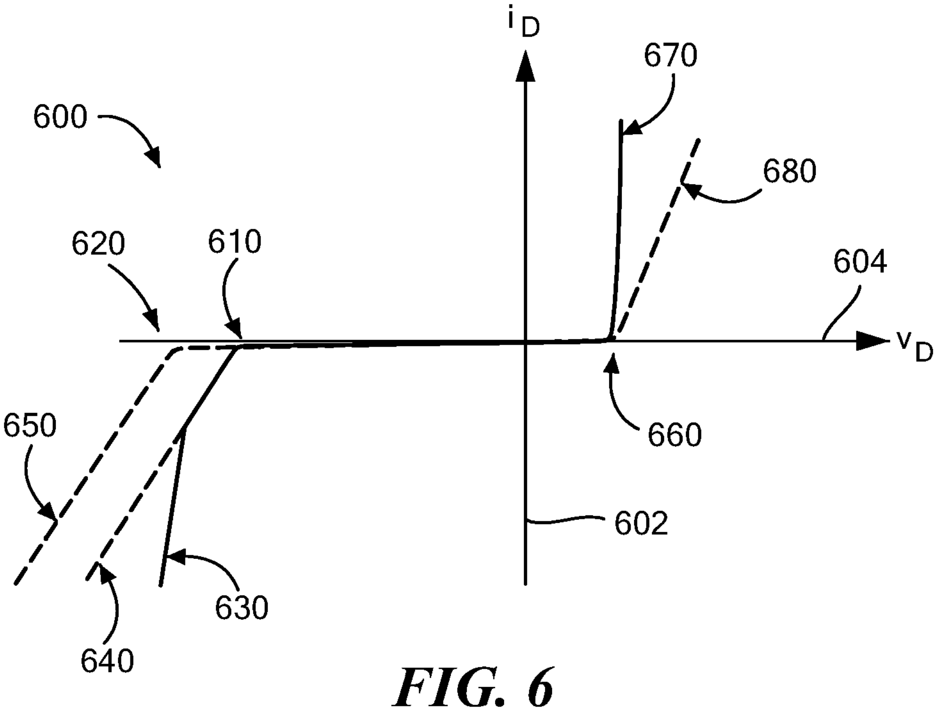
FIG. 6 is a graph disclosing voltage vs. current for a device with two polysilicon diodes with different breakdown voltages.

Referring now to FIG. 6, a graph 600 discloses voltage 604 vs. current 602 for a semiconductor electrostatic discharge (ESD) protection device with two different polysilicon diodes. The polysilicon diodes have different breakdown voltages. The ESD protection device may be similar to or the same as semiconductor electrostatic discharge protection device 400, with a first polysilicon diode referring to first polysilicon diode 442 and a second polysilicon diode referring second polysilicon diode 444.

Along the voltage 604 is a first breakdown voltage 610 for the first polysilicon diode and a second breakdown voltage 620 for the second polysilicon diode. A first measurement 630 demonstrates $1/R_{REV}$ for two different polysilicon diodes connected in parallel. A second measurement 640 demonstrates $1/R_{REV}$ for the first polysilicon diode. A third measurement 650 demonstrates $1/R_{REV}$ for the second polysilicon diode. As demonstrated, the semiconductor electrostatic discharge protection device with two different polysilicon diodes has improved measurements compared to each polysilicon diode, as exhibited by the difference in the first measurement 630 compared to the second measurement 640 and third measurement 650.

A fourth measurement 670 demonstrates $1/R_{FWD}$ for two different polysilicon diodes connected in parallel. Along the voltage 604 is a voltage on ($V_{on}$) at point 660. A fifth measurement 680 demonstrates $1/R_{FWD}$ for a single polysilicon diode. As demonstrated, the semiconductor electrostatic discharge protection device with two different polysilicon diodes has improved measurements compared to a single polysilicon diode, as exhibited by the difference in the fourth measurement 670 and the fifth measurement 680.

Figure 7:
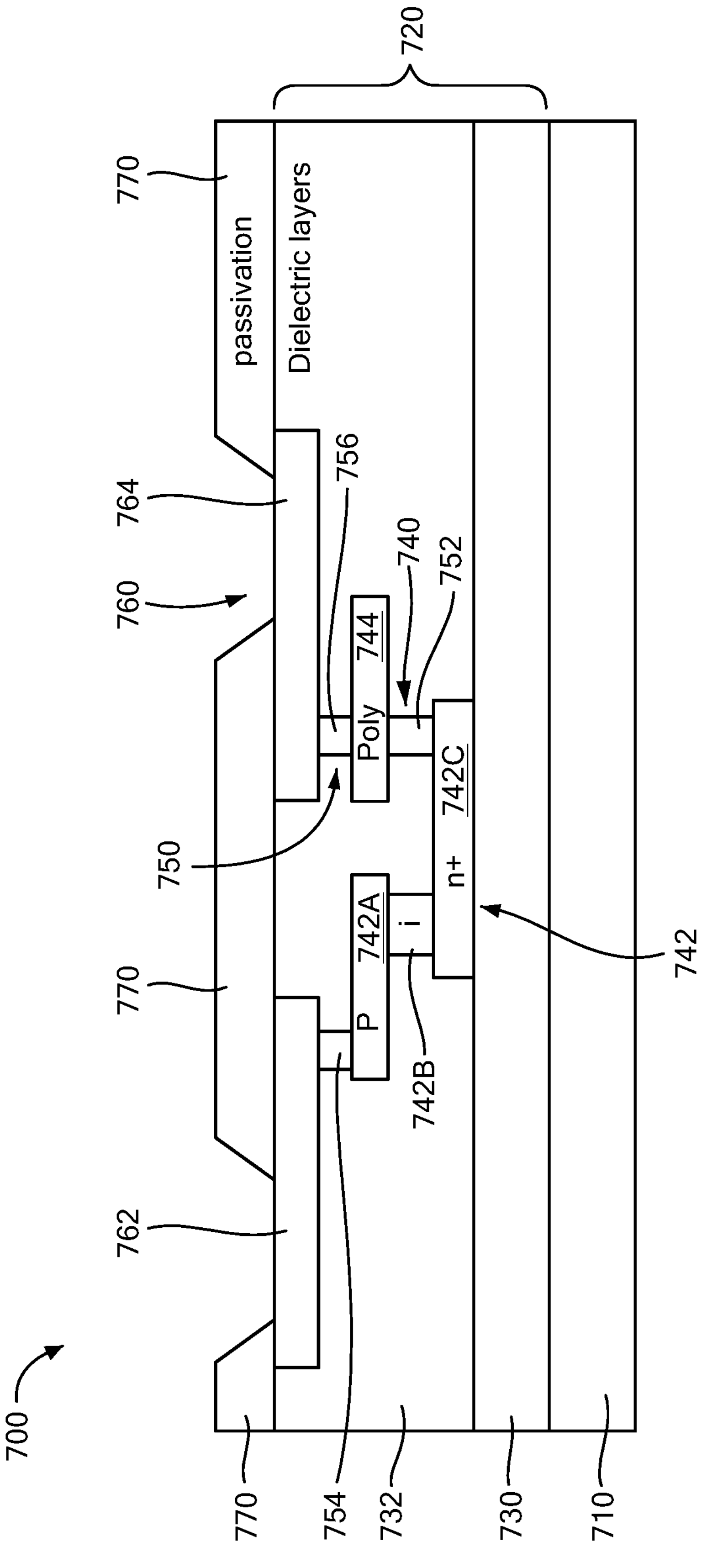
FIG. 7 is a side view of a cross section of an example of a semiconductor electrostatic discharge device that includes two polysilicon diodes connected in series.

Referring now to FIG. 7, a semiconductor electrostatic discharge protection device 700 includes two polysilicon diodes 740 connected in series. One or more dielectric layers 720 are disposed on a substrate 710. The polysilicon diodes 740 are disposed within the dielectric layers 720. One or more vias 750 are disposed within the dielectric layers 720 and connect the polysilicon diodes 740 to a metallization layer 760 with two or more metal interconnect pads 762, 764. A passivation layer 770 is disposed on the metallization layer 760 and the dielectric layers 720. The polysilicon diodes 740 are configured to provide ESD protection at the metallization layer 760. The polysilicon diodes 740 are configured to provide a desired breakdown voltage.

A first dielectric layer 730 is disposed on a substrate 710. A second dielectric layer 732 is disposed on the first dielectric layer 730. While two dielectric layers are shown, more dielectric layers may be included. The polysilicon diodes 740 are disposed on the first dielectric layer 730 and within a second dielectric layer 732.

A first polysilicon diode 742 has a vertical structure, including a vertical n-p junction. The first polysilicon diode 742 includes a portion doped with a p-type dopant forming a p-type region 742A. A portion of the first polysilicon diode 742 is doped with an n-type dopant forming an n-type region 742C. A central region 742B of the first polysilicon diode 742 is disposed between the p-type region 742A and the n-type region 742C. The central region 742B may be lightly doped with an n-type dopant or may comprise an intrinsic region. In some examples, the central region 742B has a length of about 0.1 micron to about 1 micron (+/−0.01 microns). The first polysilicon diode 742 has a vertical structure with the p-type region 742A above and adjacent to the n-type region 742C. The p-type region 742A is positioned above and adjacent to the n-type region 742C, with the central region 742B position between and connected to the p-type region 742A and the n-type region 742C.

The two polysilicon diodes 740 connected in series. A second polysilicon diode 744 is disposed in the second dielectric layer 732 adjacent to the first polysilicon diode 742.

The vias 750 connect the polysilicon diodes 740 to each other and to the metallization layer 760. A first via 752 connects the n-type region 742C of the first polysilicon diode 742 to the second polysilicon diode 744. A second via 754 connects a first metal interconnect 762 to the p-type region 742A of the first polysilicon diode 742. A third via 756 connects a second metal interconnect 764 to the second polysilicon diode 744. The semiconductor electrostatic discharge protection device 700 is not shown to scale.

Figure 8:
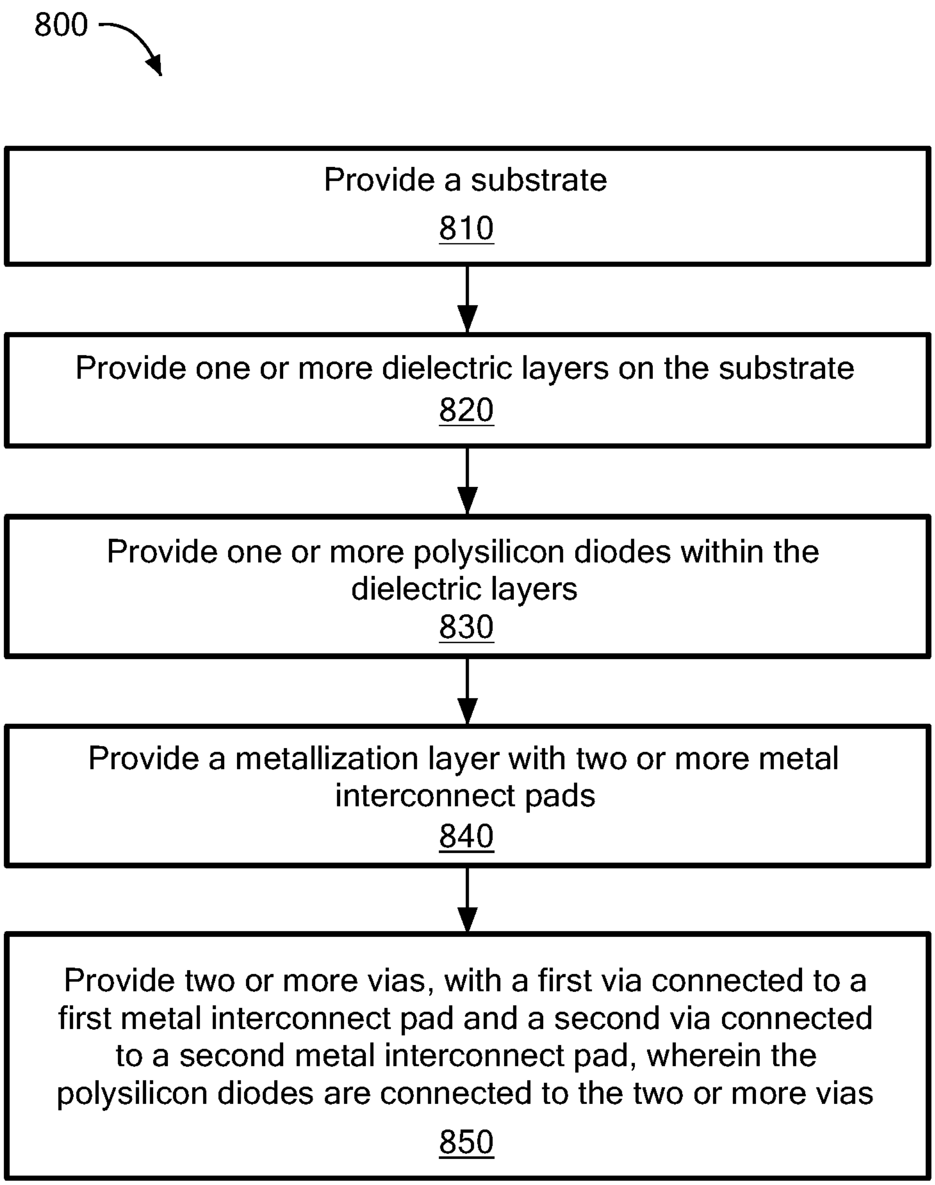
FIG. 8 is a is a flowchart of an example of a process to fabricate the semiconductor electrostatic discharge device that includes a polysilicon diode.

Referring now to FIG. 8, an example is shown of a process 800 to form a semiconductor electrostatic discharge (ESD) device. Process 800 may be used to form any of the semiconductor ESD protection devices described herein that include polysilicon diodes such as, for example, devices 100, 200, 300, 400, 700. Process 800 provides a substrate in block 810. Process 800 provides one or more dielectric layers on the substrate in block 820. Process 800 provides one or more polysilicon diodes within the one or more dielectric layers in block 830. Process 800 provides a metallization layer with two or more metal interconnect pads in block 840. Process 800 provides two or more vias, wherein a first via is connected to a first metal interconnect pad and a second via is connected to a second metal interconnect pad, wherein the polysilicon diodes are connected to the two or more via in block 850. The one or more polysilicon diodes are configured to provide ESD protection (mitigation) at the metal interconnect pads.

Referring now to FIG. 9, an example of a process flow to form a semiconductor electrostatic discharge (ESD) device with a polysilicon diode is a process 900. For example, process 900 may be used to form any of the polysilicon diodes described herein included in the semiconductor devices such as, for example, devices 100, 200, 300, 400, 700.

Process 900 provides a substrate in block 910. The substrate may be a monitor grade substrate. The substrate may be silicon doped with a p-type dopant.

Process 900 provides an oxide in block 920. The oxide may be the same as or similar to the dielectric layer described herein. The oxide may be grown or deposited as a dielectric layer. In some examples, the oxide may have a thickness of about 0.5 μm to about 1.5 μm (+/−0.1 μm).

Process 900 provides a polysilicon layer in block 930. The polysilicon may be deposited. The polysilicon may be annealed. The polysilicon may be provided by one or two (or more) lithography processes. The polysilicon may be implanted. The polysilicon may be silicide.

Process 900 provides a metallization layer in block 940. The metallization layer includes a metal 1 interconnect. The metal 1 interconnect includes the via(s) (CT) and metal layer(s) (M1) region lithography and metal deposition. The via(s) (CT) may be similar to or the same as vias 450 in FIG. 4. The metal layer(s) (M1) may be similar to or the same as metallization layer 460 in FIG. 4.

Process 900 provides an inter-metal dielectric (IMD) in block 950. The IMD may be a thick dielectric layer.

Process 900 provides a TMR block in block 960. Process 900 provides passivation and PADs openings in block 970.

Accordingly, embodiments and examples of the present disclosure can provide polysilicon diodes implemented in a simplified and inexpensive process, providing a cost-effective solution for the development of ESD protection in TMR technologies in a multi-die approach. Conventional circuit design for the applications of TMR technologies often include an embedded block of TMR around the circuitry. The ability to implement different sensing technologies along with a standard complementary metal oxide semiconductor (CMOS) integrated circuit (IC) is an advantage that requires the implementation of different dies at the package level. Multi-die systems are a solution to address the challenges of systemic complexity, allowing for accelerated, cost-effective scaling of system functionality, reduced risk and time to market, lower system power with increasing throughput, and the rapid creation of product variants. However, the implementation of multi-die systems calls for an electrostatic discharge (ESD) protection for each die.

The polysilicon diodes described herein provide a cost-effective ESD solution for TMR bridges in a separate substrate, which allows for the implementation of a multi-die approach. In conventional processes, the polysilicon ESD diodes are fabricated in an inexpensive short loop. Here, the transducer and digital domain are fabricated, while the TMR bridge die is fabricated or deposited over a separate substrate. This approach achieves improved system functionality (for TMR sensors and IC periphery) increasing production and reducing the time to market.

Although reference is made herein to particular materials, it is appreciated that other materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A semiconductor electrostatic discharge (ESD) device, comprising:

a substrate;

one or more dielectric layers disposed on the substrate;

two or more polysilicon diodes disposed within the one or more dielectric layers, wherein at least two of the two or more polysilicon diodes are different from one another and at least one of the polysilicon diodes comprises a portion of the polysilicon diode doped with a p-type dopant, a portion of the polysilicon diode doped with an n-type dopant, and a central region is disposed between the portion doped with a p-type dopant and the portion doped an n-type dopant;

a metallization layer with two or more metal interconnect pads; and two or more vias, wherein a first via is connected to a first metal interconnect pad and a second via is connected to a second metal interconnect pad, wherein the two or more polysilicon diodes are connected to the two or more vias, wherein the two or more polysilicon diodes are configured to provide ESD protection at the metal interconnect pads.

2. The semiconductor ESD device of claim 1, further comprising a magnetoresistance (MR) block layer disposed on the one or more dielectric layers, wherein the one or more polysilicon diodes are configured to provide ESD protection for the MR block layer.

3. The semiconductor ESD device of claim 2, wherein the MR block layer comprises an MR sensor having one or more MR elements.

4. The semiconductor ESD device of claim 3, wherein the one or more MR elements comprise a plurality of MR elements configured as a bridge.

5. The semiconductor ESD device of claim 4, wherein the plurality of MR elements comprises tunnelling magnetoresistance (TMR) elements.

6. The semiconductor ESD device of claim 4, wherein the plurality of MR elements comprises one or more giant magnetoresistance (GMR) elements.

7. The semiconductor ESD device of claim 4, wherein the plurality of MR elements comprises one or more anisotropic magnetoresistance (AMR) elements.

8. The semiconductor ESD device of claim 1, wherein the central region has a length of about 1 micron.

9. The semiconductor ESD device of claim 1, wherein the central region is lightly doped with an n-type dopant.

10. The semiconductor ESD device of claim 1, wherein the central region comprises an intrinsic region.

11. The semiconductor ESD device of claim 1, wherein at least two of the two or more polysilicon diodes are connected in parallel.

12. The semiconductor ESD device of claim 1, wherein at least two of the two or more polysilicon diodes are connected in series.

13. The semiconductor ESD device of claim 1, wherein the substrate comprises a monitor-grade substrate.

14. The semiconductor ESD device of claim 1, wherein the one or more polysilicon diodes are configured to provide a desired breakdown voltage.

15. The semiconductor ESD device of claim 1, wherein at least one of the two or more polysilicon diodes has a vertical structure with a vertical n-p junction.

16. The semiconductor ESD device of claim 1, wherein a first polysilicon diode has a first central region and a second polysilicon diode has a second central region, wherein the first central region is different than the second central region.

17. The semiconductor ESD device of claim 1, wherein a first polysilicon diode has a breakdown voltage and a second polysilicon diode has a second breakdown voltage, wherein the first breakdown is different than the second breakdown voltage.

18. A method for providing a semiconductor electrostatic discharge (ESD) device, comprising:

providing a substrate;

providing one or more dielectric layers on the substrate;

providing two or more polysilicon diodes within the one or more dielectric layers, wherein at least wherein at least two of the two or more polysilicon diodes are different from one another and providing at least one of the polysilicon diodes comprises doping a portion of the polysilicon diode with a p-type dopant, doping a portion of the polysilicon diode with an n-type dopant, and disposing a central region between the portion doped with a p-type dopant and the portion doped an n-type dopant;

providing a metallization layer with two or more metal interconnect pads; and providing two or more vias, wherein a first via is connected to a first metal interconnect pad and a second via is connected to a second metal interconnect pad, wherein the two or more polysilicon diodes are connected to the two or more vias, wherein the two or more polysilicon diodes are configured to provide ESD protection at the metal interconnect pads.

19. The method for providing a semiconductor ESD device of claim 18, further comprising providing a passivation layer on a surface of the dielectric layers and a surface of the metallization layer.

20. The method for providing a semiconductor ESD device of claim 18, further comprising providing a magnetoresistance (MR) block layer on the one or more dielectric layers, wherein the one or more polysilicon diodes are configured to provide ESD protection for the MR block layer.

21. The method for providing a semiconductor ESD device of claim 20, wherein providing the MR block layer comprises providing an MR sensor having one or more MR elements.

22. The method for providing a semiconductor ESD device of claim 21, wherein providing the one or more MR elements comprise providing a plurality of MR elements configured as a bridge.

23. The method for providing a semiconductor ESD device of claim 22, wherein the plurality of MR elements comprises tunnelling magnetoresistance (TMR) elements.

24. The method for providing a semiconductor ESD device of claim 22, wherein the plurality of MR elements comprises one or more giant magnetoresistance (GMR) elements.

25. The method for providing a semiconductor ESD device of claim 22, wherein the plurality of MR elements comprises one or more anisotropic magnetoresistance (AMR) elements.

26. The method for providing a semiconductor ESD device of claim 18, wherein the central region has a length of about 1 micron.

27. The method for providing a semiconductor ESD device of claim 18, further comprising lightly doping the central region with n-type dopant to form a lightly-doped n-type dopant region.

28. The method for providing a semiconductor ESD device of claim 18, wherein the central region comprises an intrinsic region.

29. The method for providing a semiconductor ESD device of claim 18, further comprising connecting at least two of the two or more the two polysilicon diodes in parallel.

30. The method for providing a semiconductor ESD device of claim 18, further comprising connecting at least two of the two or more polysilicon diodes in series.

31. The method for providing a semiconductor ESD device of claim 18, wherein the substrate comprises a monitor-grade substrate.

32. The method for providing a semiconductor ESD device of claim 18, wherein the one or more polysilicon diodes are configured to provide a desired breakdown voltage.

* * * * *